(12) United States Patent
Henze (10) Patent No.: US 7,190,221 B2
(45) Date of Patent: Mar. 13, 2007

(54) METHOD AND APPARATUS FOR MAINTAINING CONSTANT LINEARITY FOR A POWER AMPLIFIER OVER VARYING LOAD CONDITIONS

(75) Inventor: Ronald W. Henze, San Diego, CA (US)

(73) Assignee: Nokia Corporation, Espoo (FI)

( * ) Notice: Subject to any disclaimer, the term of this patent is extended or adjusted under 35 U.S.C. 154(b) by 76 days.

(21) Appl. No.: 10/971,172

(22) Filed: Oct. 22, 2004

(65) Prior Publication Data

US 2006/0087372 A1    Apr. 27, 2006

(51) Int. Cl.
*H03G 3/30* (2006.01)
(52) U.S. Cl. .................. 330/136; 330/129; 330/285; 330/284
(58) Field of Classification Search ............... None
See application file for complete search history.

(56) References Cited

U.S. PATENT DOCUMENTS

| 6,148,220 | A | 11/2000 | Sharp et al. ............... 455/572 |
| 6,362,690 | B1* | 3/2002 | Tichauer .................... 330/298 |
| 6,639,471 | B2* | 10/2003 | Matsuura et al. ........... 330/302 |
| 6,683,496 | B2* | 1/2004 | Poggi et al. ................ 330/132 |
| 6,803,818 | B2* | 10/2004 | van Amerom .............. 330/144 |
| 2003/0006839 | A1* | 1/2003 | Chominski .................. 330/140 |
| 2003/0030490 | A1 | 2/2003 | Nanao et al. ............... 330/149 |
| 2003/0076168 | A1 | 4/2003 | Forrester .................... 330/129 |

FOREIGN PATENT DOCUMENTS

| EP | 1 146 636 A1 | 10/2001 |
| EP | 1 499 016 A1 | 1/2005 |
| WO | WO 92/05631 | 4/1992 |

\* cited by examiner

*Primary Examiner*—Robert Pascal
*Assistant Examiner*—Alan Wong
(74) *Attorney, Agent, or Firm*—Harrington & Smith, PC (57) ABSTRACT

A circuit and method for applying a dynamically varying collector voltage to a power amplifier is presented. A desired output power is determined, and an input and output power of a power amplifier are measured. A processor determines, for the measured input power and the desired output power, a collector voltage. The processor controls the input power to the power amplifier using the desired output power, the measured output power, and the measured input power. The collector voltage is changeable even though the desired output RF power does not change, so the collector voltage is not fixed for a particular output RF power. Preferably, an algorithm in memory stores, for each desired output value, collector voltages for various conditions of input RF power. Collector current is maximally reduced where the collector voltages stored in memory are the lowest voltages that will meet power linearity requirements, such as may be imposed by CDMA.

24 Claims, 11 Drawing Sheets

P(n) IS THE DESIRED OUTPUT POWER

FIG.10

METHOD AND APPARATUS FOR MAINTAINING CONSTANT LINEARITY FOR A POWER AMPLIFIER OVER VARYING LOAD CONDITIONS

FIELD OF THE INVENTION

The present invention relates to power amplifiers and related power control circuitry, especially such circuitry for maintaining a linear power output when the amplifier is disposed within a handheld two-way communication device.

BACKGROUND

High frequency amplifiers for use in portable electronic devices are required to have relatively high efficiency to satisfy constraints as to size, weight, and power consumption. Radiotelephones and other two-way portable communications devices, termed herein generally as mobile stations, represent a particularly challenging environment for power amplifiers. This is because in mobile stations, power amplifiers are required to provide a substantially linear output over a wide range of radiofrequency RF input power. For example, the code division, multiple access (CDMA) wireless communication standard requires that a power amplifier exhibit good linearity. In the CDMA system, a load mismatch between the power amplifier and the antenna can result in signal distortion and degradation in performance. The end result is that under a load mismatch condition the stringent CDMA transmitter requirements can become more difficult or even impossible to meet. A mismatch might occur due to a change in antenna impedance, such as changing from the ideal 50-ohm free space impedance (which is matched at the power amplifier) to a much higher impedance when a user touches the antenna.

Figures 1, 2:
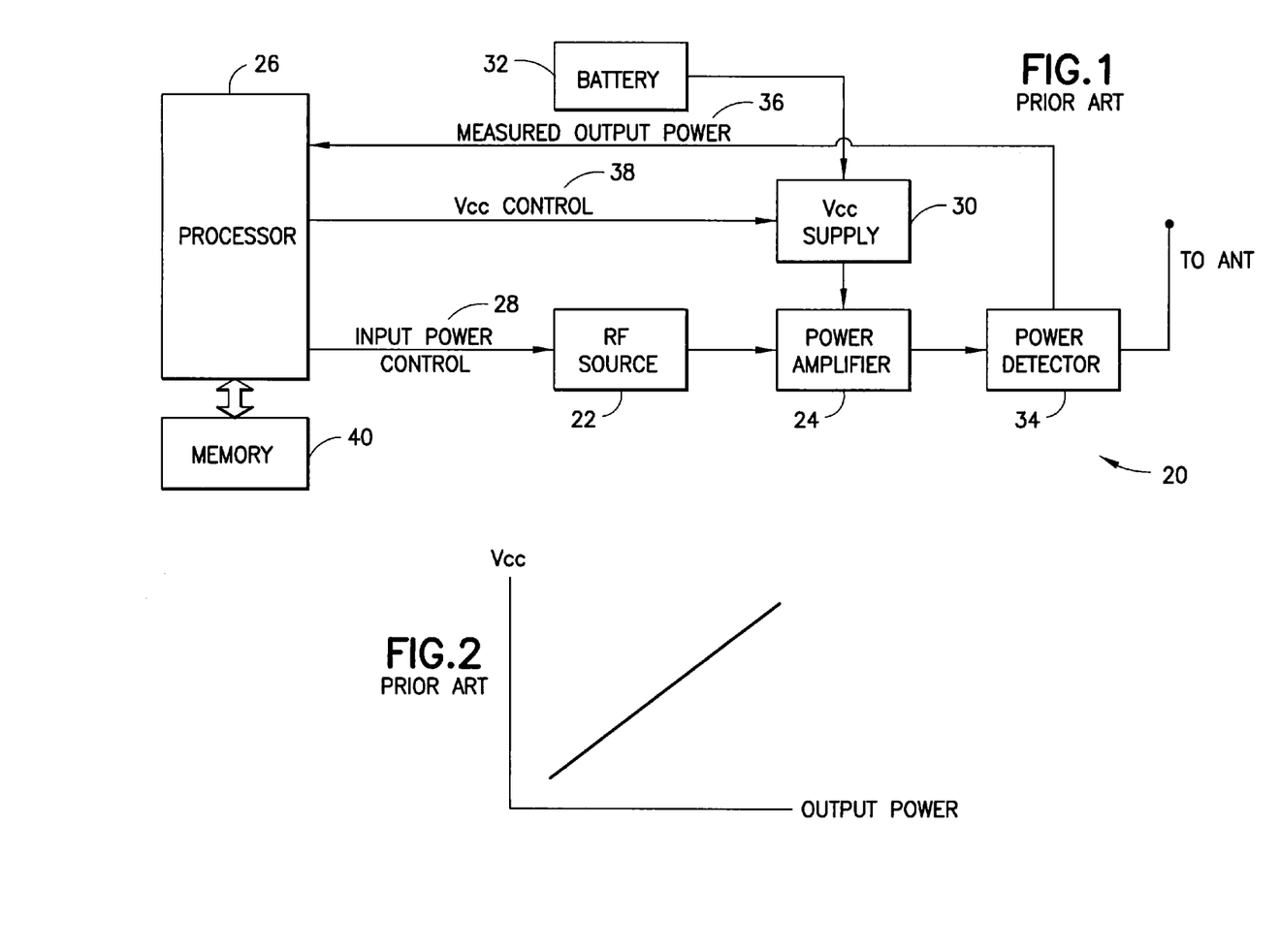
FIG. 1 is a schematic block diagram of relevant portions of a prior art transmitter showing a power amplifier and associated circuitry.
FIG. 2 is a prior art graph relating desired output power from a power amplifier to collector voltage, according to the prior art circuit of FIG. 1.

FIG. 1 is a simplified block diagram of relevant portions of a prior art mobile station transmitter 20. A digital signal from a RF source 22 is input into and amplified by a power amplifier PA 24. The power level of the signal from the RF source 22 is controlled by a processor 26 via an input power control 28, which is a control signal and not the RF signal itself. The amount by which the PA 24 amplifies its input signal is determined by a collector voltage $V_{CC}$ supply 30, which allows a particular voltage from a battery 32 or other power source through to the PA 24. The PA 24 outputs the digital signal toward a transmit antenna (not shown). The power of the signal that is output from the PA 24 is sensed at a power detector 34, commonly within a directional coupler. The processor 26 also controls the amount of collector voltage through a $V_{CC}$ control line 38.

There are two instances where power adjustments are made to the circuit of FIG. 1: changes to achieve an established desired output power, and changes to the desired output power itself. Toward the former, the power detector 34 feeds back a measured power output signal 36 to the processor 26. When the processor 26 determines that the measured output power 36 from the power detector 34 varies from a desired level (e.g., the difference between measured and desired power exceeds some threshold), the processor 26 makes an adjustment to the RF source 22 via the input power control 28. For a change to the desired power output itself (e.g., when a transmit antenna experiences a change in impedance that necessitates a new desired PA output power), the processor adjusts the $V_{CC}$ supply 30 via the $V_{CC}$ control 38. For each desired output power from the PA 24, there is one collector voltage.

Prior approaches use a fixed collector voltage for each desired level of PA output power to ensure linearity of output power over all conditions. This is not to say that output power is fixed to a single value, but that for each output power from the power amplifier, there is only one collector voltage. For example, in a CDMA cellular system using power control between a base station and mobile stations within its cell, a particular mobile station may be required to make a power adjustment so that its transmissions will not interfere with those of other handsets. Alternatively, a mobile station user may touch the antenna with his/her hand, increasing load on the antenna. Each of these will result in a change to the desired power output from the power amplifier, and consequently a change in the collector voltage. However, once the new desired output power is determined, there is only one collector voltage matched to that output power. This is shown graphically in prior art FIG. 2, illustrating a one-to-one correspondence between desired output power and $V_{CC}$. The relation between desired output power and $V_{CC}$, as well as a relation between input power control 28 and measured/desired output power, is generally stored in a memory 40 that the processor 26 accesses to make adjustments via the input power control 28 and the $V_{CC}$ control 38. The overarching purpose of this approach is directed toward maintaining a linear power output. Various specifications, such as those described above for wireless telecommunications, dictate this linearity.

What is needed in the art is a power amplifier and circuitry to provide linear power outputs that more efficiently use the available limited power supply of a handheld mobile station.

SUMMARY OF THE INVENTION

In accordance with one aspect of the invention is a method to output a signal at a desired power from a power amplifier. This method includes driving a power amplifier with an input signal to provide an output signal at a desired power. The input signal has a variable power. The method further includes feeding back a portion of the input signal, preferably a measure of signal power level that is input into the amplifier. In response to a variance in power of the input signal, the method includes varying a collector voltage of the power amplifier to maintain the desired power of the signal that is output from the power amplifier.

This invention is in one aspect a method to dynamically control output power from a power amplifier. In the method, a desired output power from a power amplifier is determined, and a first input power to the power amplifier is measured at a first time instant. A first collector voltage based on the first input power is determined and applied to the power amplifier to achieve the desired output power. Further in the method, a second input power to the power amplifier is measured at a second time instant. A second collector voltage based on the second input power is determined, and that second collector voltage is applied to the power amplifier to achieve the desired output power. Preferably, the desired output power, the first input power, and the actual output power are used to control the second input power also.

In accordance with another aspect, the present invention is a method for operating an amplifier. In this aspect of the invention, a first collector voltage is applied to an amplifier, and an output power of a signal output from the amplifier is measured. A difference is determined between the measured output power and a desired output power. In response to determining the difference, an input power level of the signal input into the amplifier is adjusted. A second collector voltage is applied to the amplifier to change the amplifier gain.

The present invention is in another aspect a circuit for varying a collector voltage applied to a power amplifier. This inventive circuit includes a power amplifier and a first detector for measuring a first and second input power to a power amplifier. Further in the circuit is a memory for storing a desired output power, and a processor. The processor is coupled to the memory and to the detector, and is for determining a first and second collector voltage based on the desired output power and the respective first and second input powers. The circuit further has a collector voltage supply that is coupled to the processor. The collector voltage supply is for supplying the first and second collector voltage to the power amplifier. The power amplifier outputs a signal at the desired output power in response to each of the first and the second collector voltages.

The present invention is in yet another aspect a circuit for outputting a signal at a desired power. The circuit includes a signal source, a power amplifier, a feedback loop, a processor, and a collector voltage supply. The power amplifier has an input coupled to the signal source for receiving an input signal having a variable power, and the power amplifier is for outputting an output signal at a desired power. The feedback loop has a node disposed between the signal source and the power amplifier for feeding back a portion of the input signal. Preferably, this node is a power detector and the portion of the input signal is a measure of input signal power. The processor is coupled to the feedback loop for determining a collector voltage based, at least in part, on the portion of the input signal. The collector voltage supply has a control input coupled to an output of the processor and an output coupled to the power amplifier for providing a variable collector voltage. The power amplifier provides an output signal at a desired power level while the collector voltage varies between at least two values.

These and other features, aspects, and advantages of embodiments of the present invention will become apparent with reference to the following description in conjunction with the accompanying drawings. It is to be understood, however, that the drawings are designed solely for the purposes of illustration and not as a definition of the limits of the invention.

BRIEF DESCRIPTION OF THE DRAWINGS

The present invention is described below more particularly with reference to the following drawing figures, which are not to scale except where stipulated.

DETAILED DESCRIPTION

As an overview of the inventive concept, a collector voltage is dynamically changeable for a single output power of a power amplifier. Ideally, excess linearity in power output, over and above a minimum linearity required by an operative telecommunication specification or other external criteria, is exchanged to save collector current. An adaptive collector voltage control reduces and thereby saves collector current as compared to exceeding those minimum linearity requirements with a fixed collector voltage that does not change for a given power output.

The following acronyms are used in the below detailed description:
DPO—Desired Output Power
APO—Actual Output Power
DPI—Desired Input Power
API—Actual Input Power
PA—Power Amplifier
$V_{CC}$—Power Amplifier Collector Voltage
$I_{CC}$—Power Amplifier Collector Current In the prior art, there is one fixed collector voltage for each level of desired power output from a power amplifier. To comply with linearity requirements, such as those stipulated in a telecommunication standard such as CDMA, the value of the collector voltage for any given output power was determined under the worst case conditions, such as temperature, frequency, high antenna VSWR and minimum battery voltage. However, under conditions other than worst case, this results in a higher collector current than is necessary, resulting in excess current draw that does not serve a viable purpose. The inventor has recognized that collector current can be exchanged for linearity in power output from the power amplifier, and has developed an invention that in effect exchanges collector current for power linearity in a dynamic manner. Whereas prior approaches to power amplifiers use a fixed collector voltage over all conditions, the present invention saves collector current to the extent that an average collector current over an average of actual conditions is less than the fixed collector current currently in use. While the advantages are most pronounced in a mobile device or other device relying on a galvanic power source, the present invention can be deployed in any device using a power amplifier having a variable power output, and the power savings can be maximized where there is a requirement for linear power output.

Figure 3:
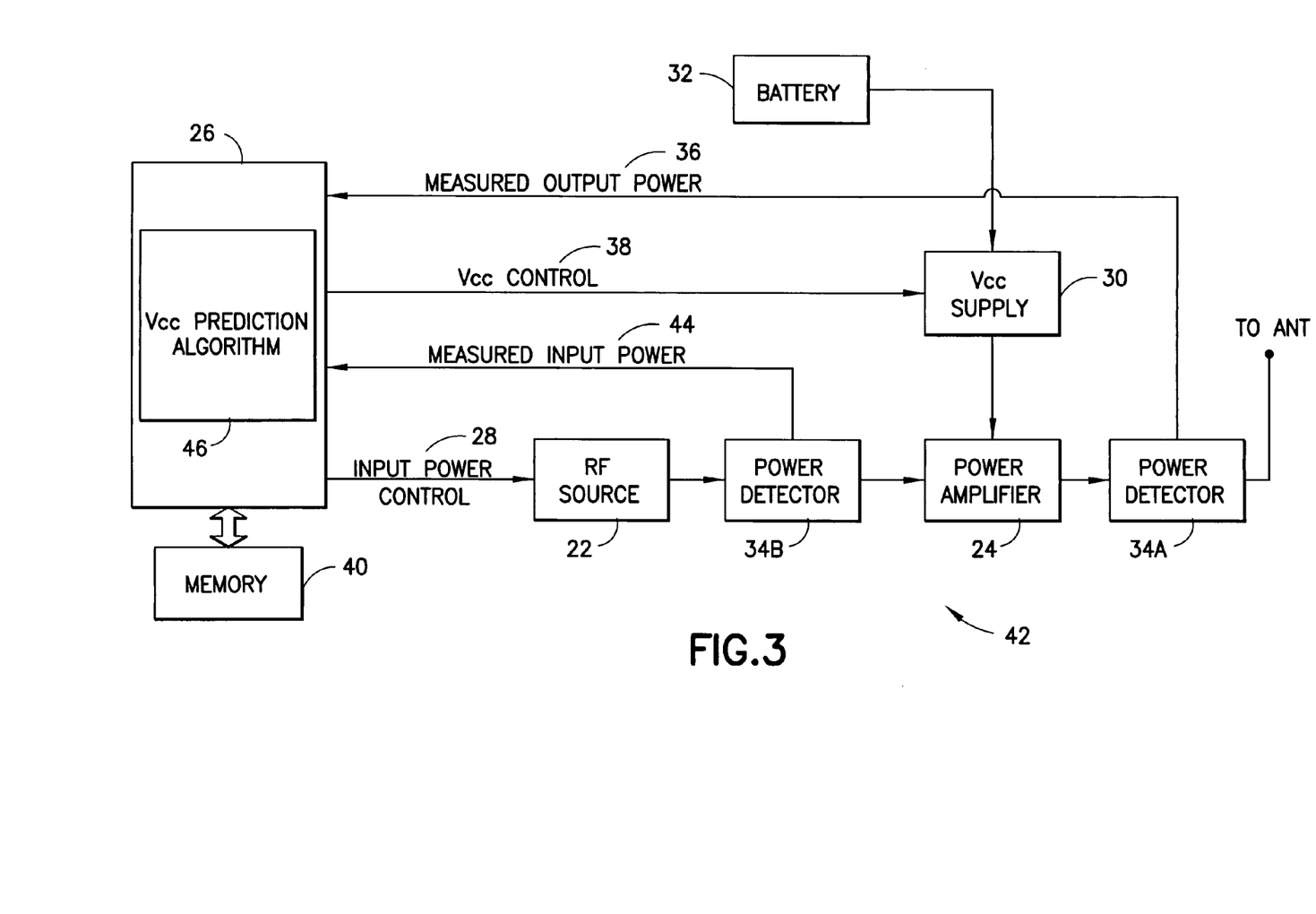
FIG. 3 is a block diagram of relevant portions of a transmitter showing a power amplifier and associated circuitry according to the preferred embodiment of the present invention.

FIG. 3 is a block diagram of a transmitter 42 showing a power amplifier and associated circuitry according to the preferred embodiment of the present invention, which is explained beginning with the power amplifier 24 near the center of the diagram. Like reference numbers to those used in FIG. 1 reflect like components. Where the power detector that provides the measured output power 36 to the processor 26 is a first power detector 34A, a second power detector 34B is disposed between the RF source 22 and the PA 24, and provides to the processor 26 a measured input power 44 (API) of the signal input to the PA 24. At a first time instant, the APO from the PA 24 is measured at the first power detector 34A, such as a directional coupler, and provided 36 to the processor 26. The API into the PA 24 is also measured at the second power detector 34B, and provided 44 to the processor 26. A third input to the processor 26 is DPO, the desired power output that is controlled, at least in a spread spectrum system, by a power control regimen (i.e., open loop, closed loop, or hybrid) between a base station and mobile stations within an operative cell. The DPO may also be modified by the first power detector 34A (such as when that component is within a directional coupler) when a change in antenna impedance is evident so that the power radiating from the antenna complies with the power level needed in the cell. DPO figures may be stored in the memory 40 and selected based on feedback to the processor 26.

The processor 26 includes a $V_{CC}$ prediction algorithm 46, which is executed by the processor 26 but which may be stored in the memory 40. Preferably, various discrete values for collector voltage are also stored in the memory 40 and each associated with a desired output power, an actual input power and a measured or actual output power. The memory may be any medium for storing computer readable data, such as RAM, ROM, and the like. Alternatively, the memory may associate each collector voltage with a desired output power and another parameter that takes into account the actual input power, temperature, frequency, and any other variances that may affect amplifier power.

However the input conditions are entered, either as search elements for a lookup table or computational elements by which the processor calculates $V_{CC}$ for the relevant conditions, the processor 26 determines a collector voltage and outputs a control signal 38 to that effect to a $V_{CC}$ supply 30. In applying the $V_{CC}$ that derives from the actual power input at the first instant, the power amplifier 24 seeks to output a power at the desired power level DPO.

An RF signal source 22 provides the input signal at an input power to the PA 24. The signal source 22 may be embodied as a modified mixer or DAC, or any of several other functional components through which the signal passes prior to being amplified at the PA 24. At a first time instant detailed above, the RF signal source 22 provided a signal that was measured at the second power detector 34B as the first input power. Assume that at a second time instant, the RF signal source 22 provides a signal whose power is measured at the second power detector 34B as a second input power that differs from the first. The first and second time instants are characterized in that they both span a time period over which the desired output power does not change. That is, there is no change in impedance at the antenna that would drive a new desired power output from the power amplifier 24, and no direction to change antenna transmission power from the base station directing a mobile station in which the power amplifier 24 is disposed.

The circuit of FIG. 3 is characterized in that a different $V_{cc}$ is applied to the power amplifier 24 for the second time instant, while the power amplifier desired output power (and ideally actual output power) remains the same. The different $V_{CC}$ may be selected from the lookup table in memory, or calculated from an algorithm stored in memory, but is based on the second input power that differs from the first input power. The collector voltage is thus dynamically changeable for a given output power of the amplifier 24. Preferably, the first 34A and second 34B detectors each provide an analog signal so that the applied collector voltage $V_{CC}$ is continuously updated for the varying input powers (and any variances in output power, temperature, frequency, and desired output power, which typically change much less frequently).

While dynamically adjusting $V_{CC}$ without changing desired power output will itself result in some current savings, those savings are maximized when $V_{CC}$ is reduced to as low a level as possible. For most applications and especially in telecommunications, there is some external requirement for transmitter power linearity to promote efficient receiver design. In wireless telecommunications, CDMA is one such external requirement. By driving the power output linearity to the lowest level consistent with the standard (minimum linearity), $V_{CC}$ is thereby reduced to the lowest level and collector current $I_{CC}$ is minimized. In this manner, DC current is 'traded' for output power linearity. Because $V_{CC}$ changes dynamically, it need not satisfy worst-case scenarios for temperature and frequency unless the operating device is actually operating under those conditions, which will be reflected in the measures of APO (or similar) and API. Because linearity is leveled over all load conditions, a result is that linearity margin is minimized (linearity margin being the linearity of an actual power output curve that is over and above the minimum required linearity).

Because the power of the signal source 22 is controllable, the processor may also provide a control signal 28 so that the second input power is modified from the first according to the desired output power, the actual output power, and the actual input power (e.g., second API=desired power input=DPO−APO+first API). As shown in prior art FIG. 1, the DPO, APO, and API from a first time instant can be used to control the API at a next time instant by driving power into the RF signal source 22, since this generally comes via some power regulating circuitry. But as described above, to assure output linearity when only one collector voltage is available for each desired power output, excess linearity must be built in to account for worst-case conditions. Because worst-case conditions do not represent actual conditions except occasionally, collector current $I_{CC}$ (and battery power) is wasted at all but those occasional instances.

Figure 4:
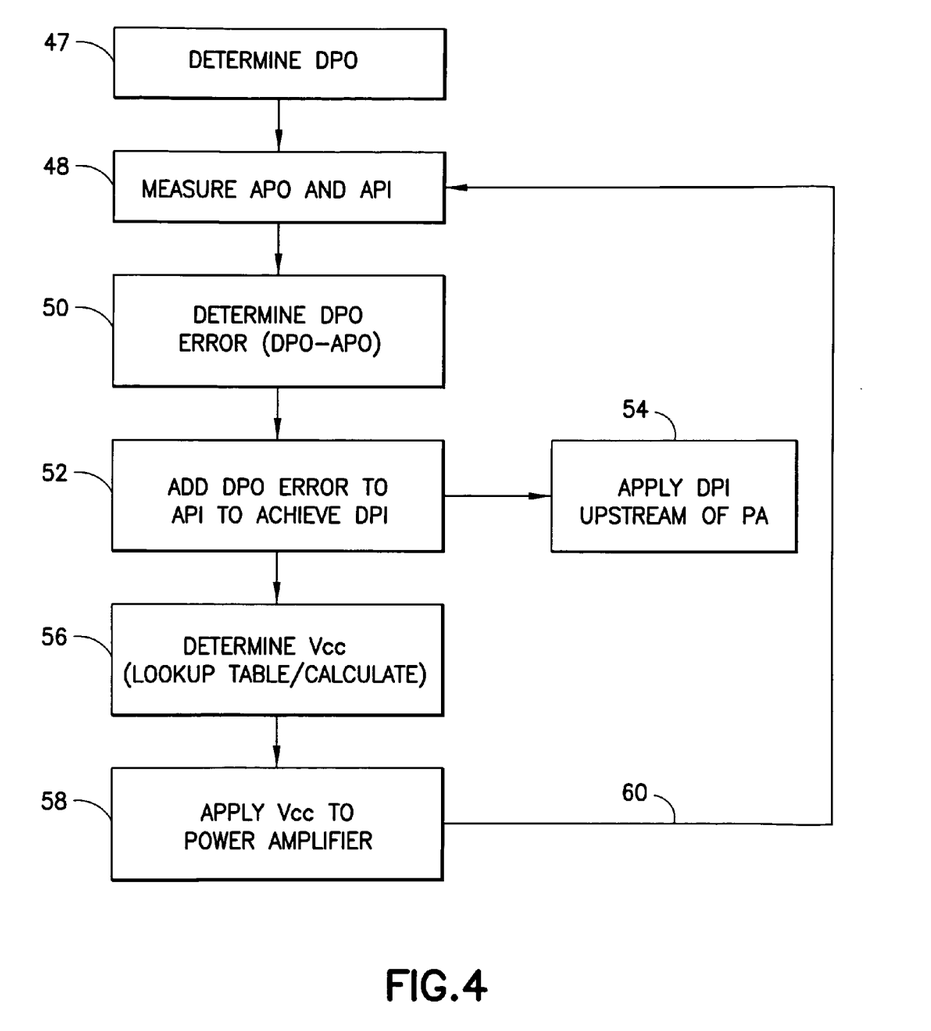
FIG. 4 is a flow diagram showing a method according to the preferred embodiment of the present invention.

As is evident from FIG. 3 and particularly detailed in FIG. 4, a method for implementing the invention according to the preferred embodiment is shown. DPO is determined at block 47. API and optionally APO are measured at block 48 (not necessarily in the same step), APO is subtracted from DPO to determine a DPO error 50, and the DPO error is added to API to achieve DPI 52. At block 54, DPI is applied to a signal source located upstream of (prior to) the PA 24. Preferably at the same time after DPI is achieved, the method entails calculating $V_{CC}$ 56 using DPO and DPI, and applying the $V_{CC}$ to the PA 58 to correct the next APO toward DPO. The method is continuous via a repeat loop 60, which returns to block 48 rather than block 47 to indicate that DPO is unchanged for the various calculations of $V_{CC}$. Preferably, this method is done using the lowest possible $I_{CC}$ (DC-current) that allows the overall circuit to meet the minimum power linearity requirements of an operable communication standard. It is important to note that the present invention may operate independent of antenna load or power amplifier output load; for a single DPO, it calculates or predicts $V_{CC}$ based on API to drive APO to DPO. Another important aspect is that DPO may be determined based on the minimum power linearity required by some external control, such as CDMA.

Figure 5A:
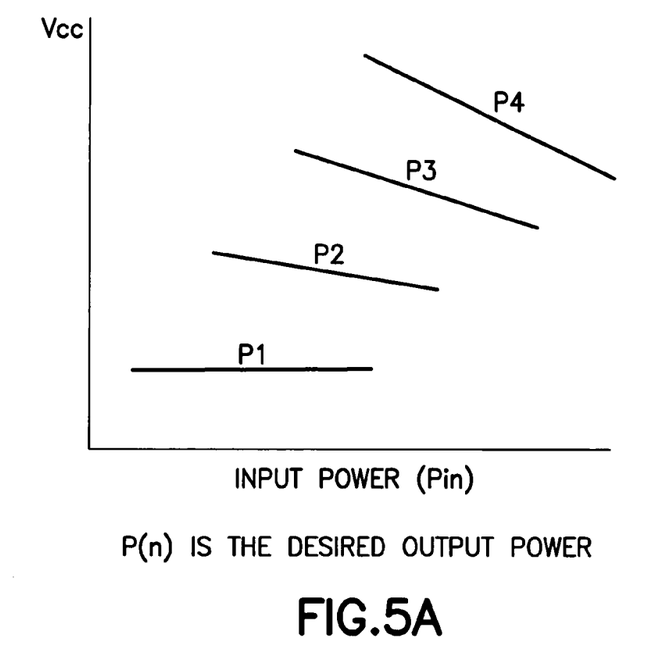
FIG. 5A is a graph of API versus $V_{CC}$, showing linearity of output power for several output powers P1–P4.

FIG. 5A is a graph of API along the horizontal axis and $V_{CC}$ along the vertical axis, showing linearity of output power for various input powers and collector voltages $V_{CC}$. The data points are connected by a linear best-fit line, for which the relevant equation (of the form $V_{CC}$=a(API)+b, where a and b are constants) is adjacent to the related best-fit line. Whereas the data of FIG. 5A may be calculated in a laboratory, the best-fit equations may be stored in a memory (such as the memory 40 of FIG. 3) and applied by a processor to achieve $V_{CC}$ values for all possible API's and DPO's reflected in FIG. 5A, and the invention need not be limited to selecting APO from a series of discrete values but rather may enable any APO value from one of the lines. Alternatively, various data points (either true data points or points along the best-fit line) may be stored in a memory such as in the form of a lookup table, and the processor may interpolate between them where necessary to fit measured conditions of API. Each line of FIG. 5A represents one desired power output. In comparing the graphs of FIG. 5A to FIG. 2, note that while the horizontal axis of FIG. 2 is output power, the horizontal axis of FIG. 4 is input power. So long as the slope of the API v. $V_{CC}$ line is not horizontal, there is more than one collector voltage for a given DPO. The present invention is practiced when the $V_{CC}$ supply 30 of FIG. 3 provides more than one collector voltage for a given DPO from the PA 24. The lines of FIG. 5A also each reflect a constant temperature.

Where a temperature change occurs and a temperature correction is made, the inventor has demonstrated in laboratory simulations that the resultant lines of output power for the differing temperatures exhibit substantially the same slope and linearity, and are offset by some nominal collector voltage $V_{CC}$ value. A change in temperature may be reflected in a change in the value DPO−APO+API. The data of FIG. 5A is generated by test and measurement of multiple power amplifiers of the same family, using a given desired power output for each depicted line.

Figure 5B:
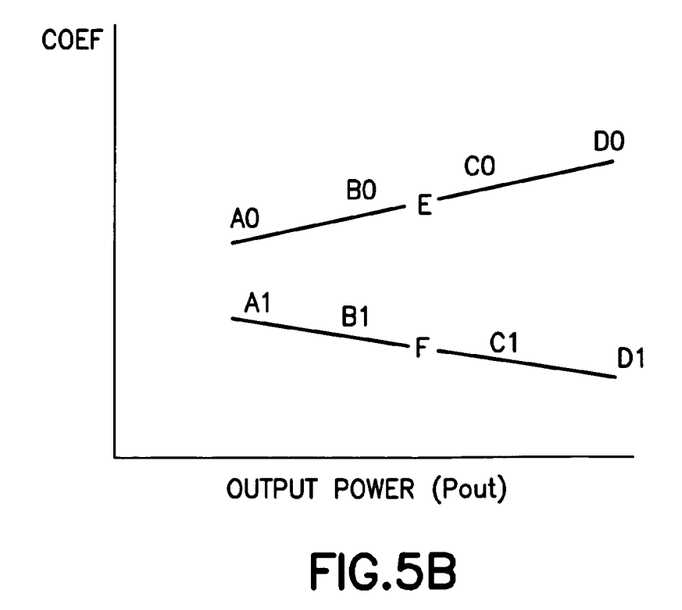
FIG. 5B is a plot of coefficients for the equations that define the output power lines P1–P4 of FIG. 5A.

Constant linearity (ACPR1 per IS-98D) was maintained by varying $V_{CC}$ and API over the various DPO output loads. In general, each line of FIG. 5A may be represented by the equation $DPO_i = P_i = a_i[API] + b_i$, where i represents an index related to the particular desired output power and $a_i$ and $b_i$ are constants for that $DPO_i$. Specifically, the coefficients $a_i$ and $b_i$ for the various powers $P_i$ are plotted at lines E and F, respectively, in FIG. 5B. For the case where the equations for the lines of FIG. 5A are represented as P4=A0*Pin+A1; P3=B0*Pin+B1; P2=C0*Pin+C1; and P1=D0*Pin+D1, the coefficients are represented by the equations Coefficient0=E0*DPO+E1 and Coefficient1=F0*DPO+F1. As shown in FIG. 5B, these coefficient equations yield a linear result, which can be stored in the memory 40 to derive an infinite number of coefficients and $V_{CC}$ values for any allowable set of DPO. The final $V_{CC}$ prediction algorithm may then be expressed as $$V_{CC}=(E0*DPO+E1)*API+(F0*DPO+F1) \quad [1]$$

Different amplifiers may yield more complex curves than the linear equations reflected in FIGS. 5A–5B.

While the present invention is not so limited, the inventor has derived an equation applicable for nearly all desired output powers for the CDMA standard. It may also be operable for other applications beyond mobile telecommunications. Specifically, where the coefficients a-f will vary depending on the transmitter which is being characterized:

$$V_{CC}=(a*DPO+b)*API+(c*DPO^3-d*DPO^2+e*DPO+f) \quad [2]$$

Note that the collector voltage $V_{CC}$ depends only on DPO and API. The input voltage may also be controlled using these same parameters. Analytically, the present invention is characterized by measuring API and $V_{CC}$ for various output load conditions. The resultant graph of API versus $V_{CC}$ will yield a straight line (or nearly so, FIG. 5A illustrates best fit lines) with some slope. $V_{CC}$ prediction according to the present invention enables the use of less expensive power amplifiers at a lower power consumption while meeting linearity over various and wide ranging load requirements.

Figure 6:
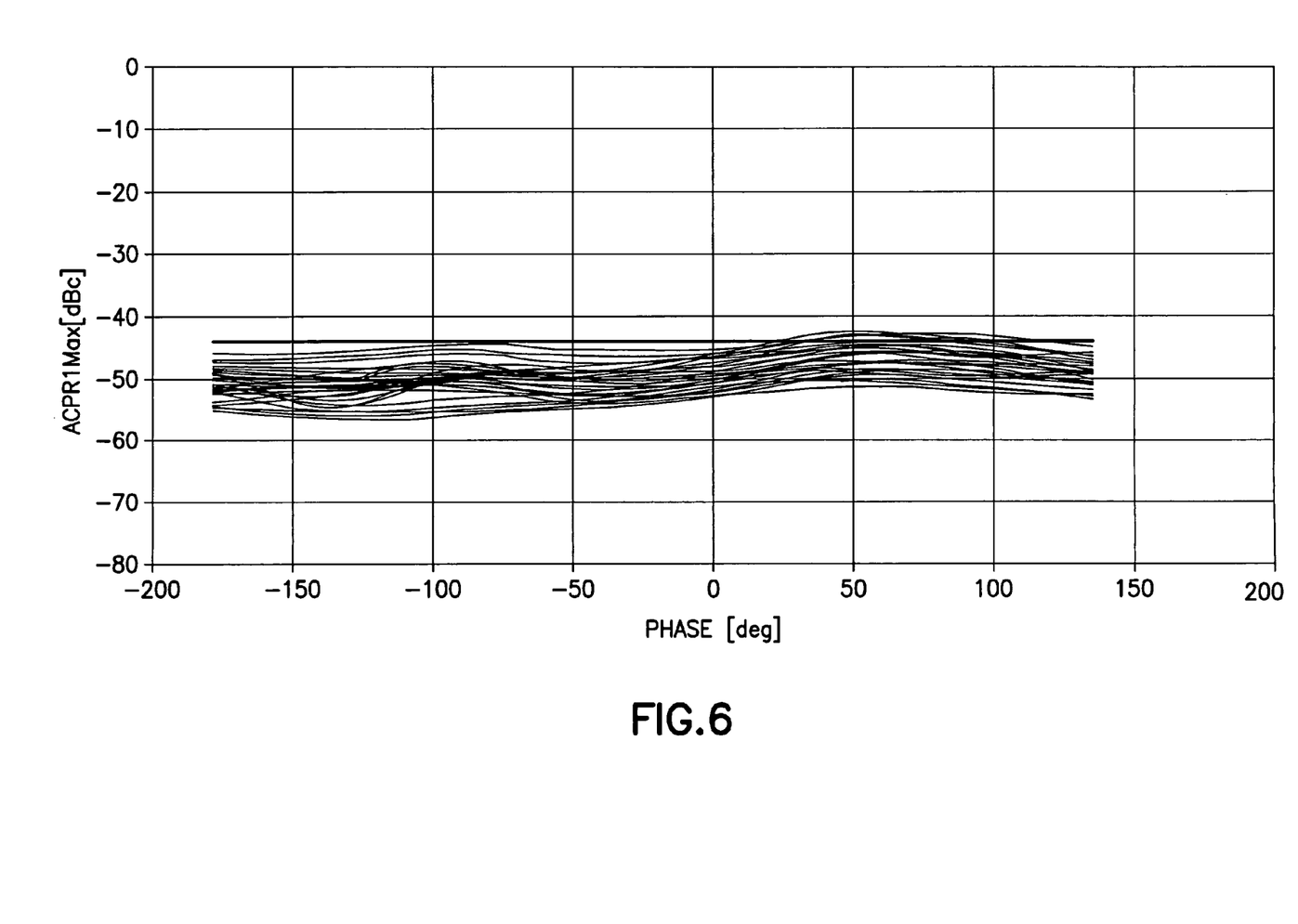
FIG. 6 is a graph showing optimized linearity margin for various phase offsets.

FIG. 6 is a graph illustrating a 'swing' or variance in PA linearity for various power levels, VSWRs and phase offsets. The total collector voltage variance over all conditions is on the order of about 10 dB of change in adjacent channel power, whereas using only one fixed collector voltage for all conditions generally exhibits a variance in linearity on the order of about 30 dB (between −30 dB and −70 dB in a sinusoidal shape across the graphed range of phase). The straight horizontal line at about 44 dB represents the limit of the Adjacent Channel Power 1 metric (ACPR1), which the plot for $V_{CC}$ satisfies in nearly all conditions and phases.

Figure 7A:
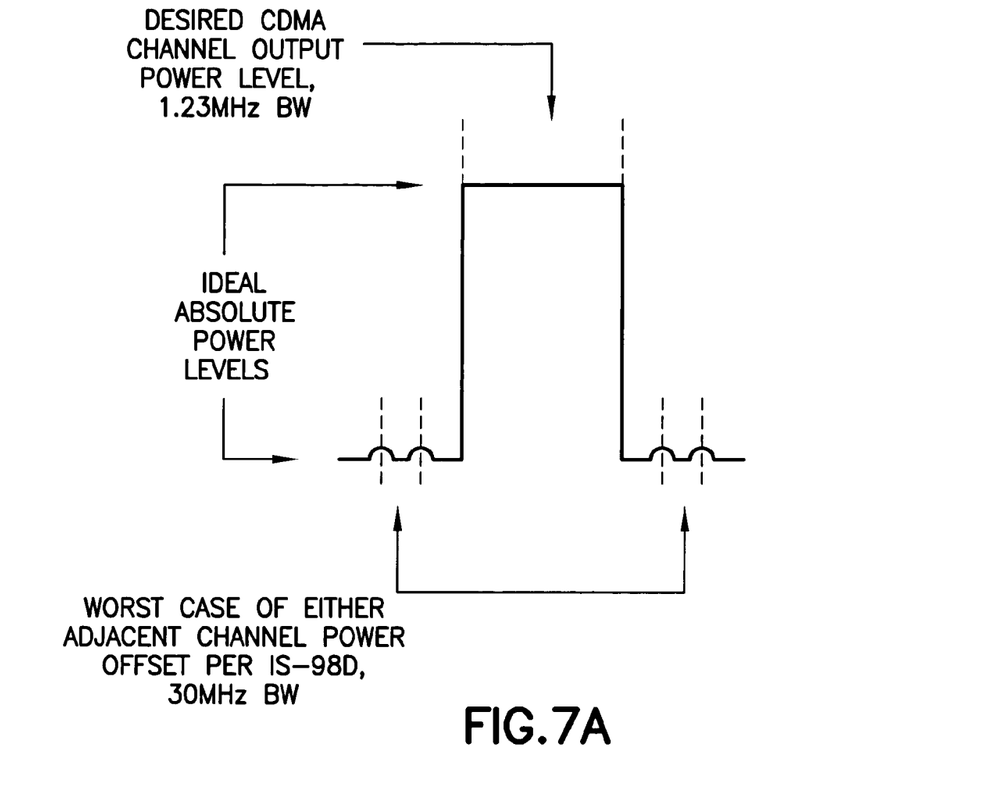
FIGS. 7A–7E are signal power diagrams showing signal output power as adjusted by the teachings herein to correct for the case when measured output power drops below desired output power.
Figure 7B:
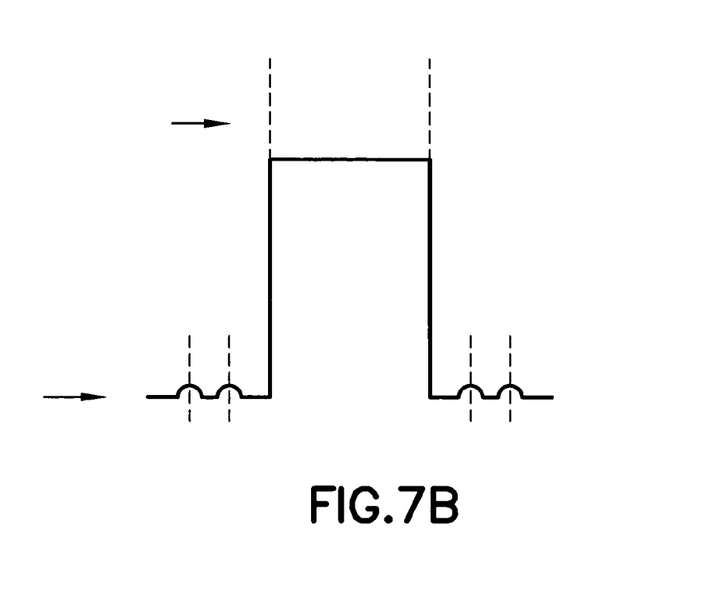
Figure 7C:
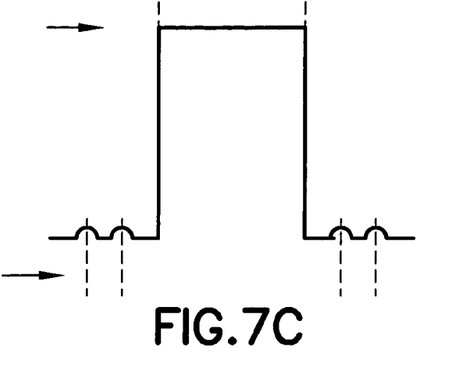

FIGS. 7A–7E graphically depict signal power as output from a power amplifier 24 at different time instances as modified by the present invention. In each, the horizontal arrows indicate ideal absolute power levels. In FIG. 7A, the signal carries at the desired output power level and linearity just meets the externally defined limit (e.g., some specification) with little or no margin. This is the ideal power output that wastes little or no collector current $I_{CC}$. At FIG. 7B, some disruption to the RF field causes the antenna impedance to change, causing the load seen by the output of the PA 24 to also change. As the load seen by the PA output changes, so does the load on the PA 24, and the actual output power of FIG. 7B is below the ideal power (upper horizontal arrow). In response to the situation at FIG. 7B, the processor increases input power to the RF source 24 to restore the desired output power as in FIG. 7C. While APO now meets DPO, the noise floor is also increased above the ideal (lower horizontal arrow). To maintain the linearity requirements of ACPR1 in CDMA telecommunications, the collector voltage $V_{CC}$ is increased at FIG. 7D, increasing the gain of the power amplifier 24. This is preferably according to the $V_{CC}$ predictive algorithm detailed above, or drawn form a table derived from a similar algorithm.

Figure 7D:
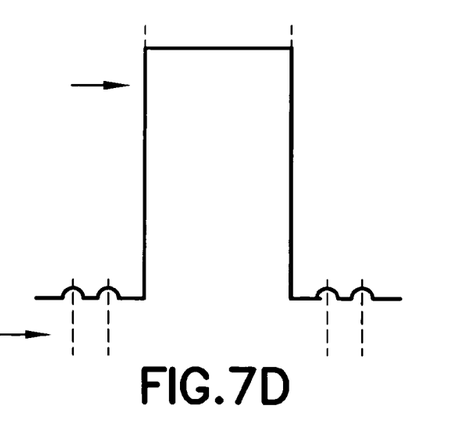
Figure 7E:
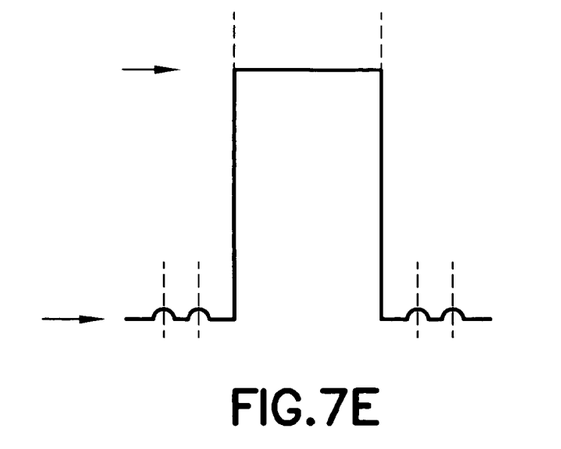

In FIG. 7D, both DPO and noise exceed the ideal levels (horizontal arrows). The first power detector 34A (FIG. 3) detects the excess, and the input power to the power amplifier is reduced via the input power control 28 (FIG. 3) to settle the actual output power toward the ideal DPO as in FIG. 7E. This also settles the noise floor to the ideal, since the PA gain is unchanged due to the input power control. As with FIG. 7A, this represents the minimum linearity requirements, but at the lowest possible draw of collector current $I_{CC}$.

Figure 8A:
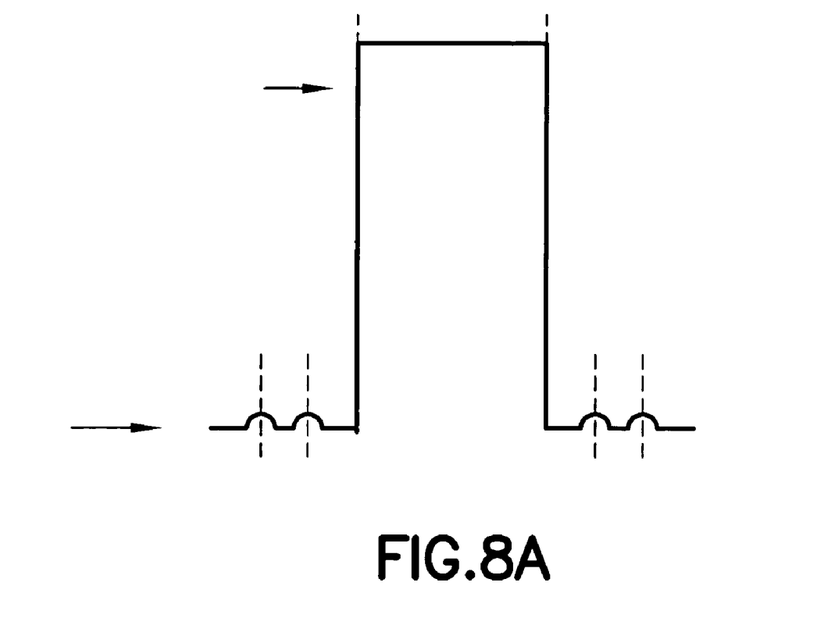
FIGS. 8A–8D are similar to FIGS. 7B–7E, but to correct for the case when measured output power rises above desired output power.
Figure 8B:
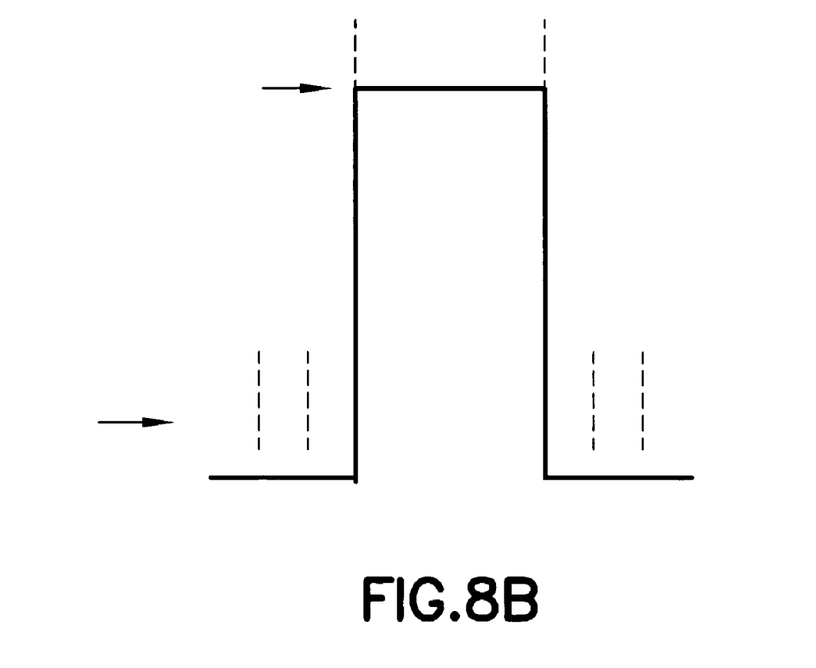
Figure 8C:
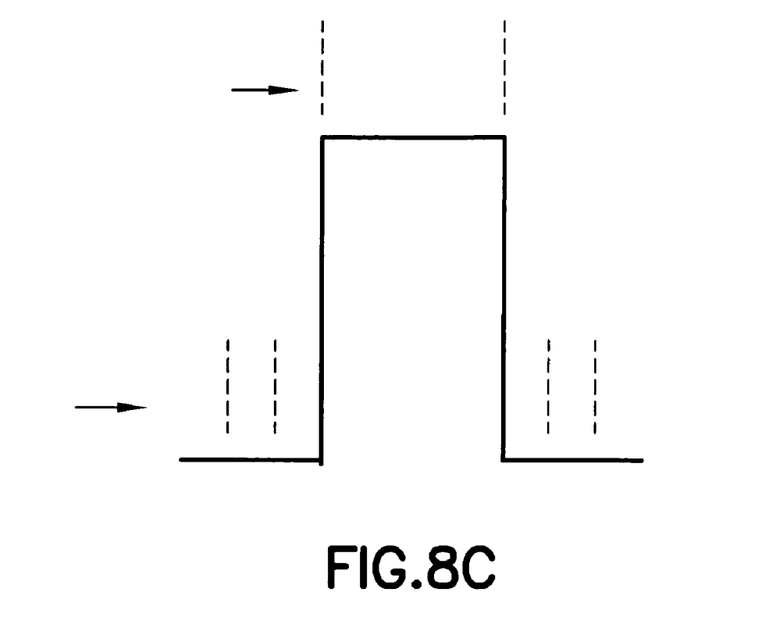
Figure 8D:
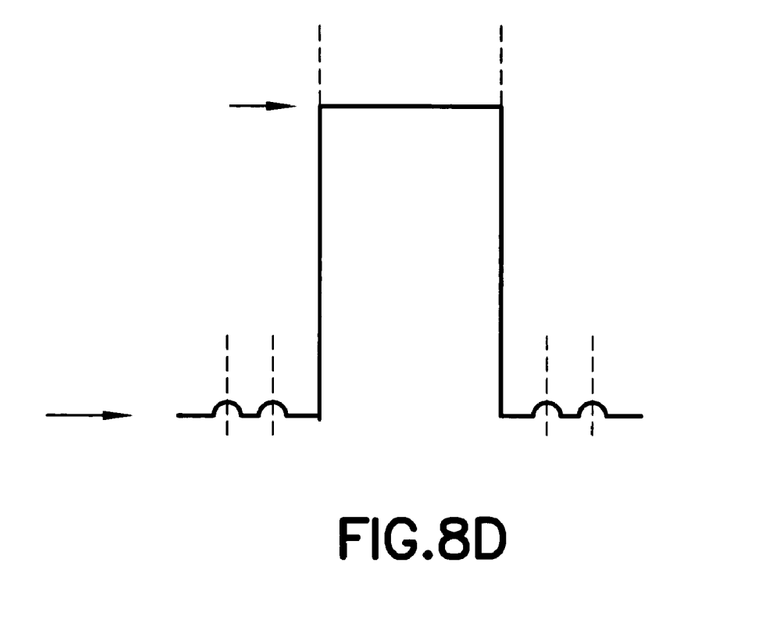

FIGS. 8A–8D similarly illustrate the opposite scenario, where a change to the antenna impedance initially causes the power output from the power amplifier 24 to exceed the ideal. Assume a starting point of FIG. 7A. In FIG. 8A, the impedance change causes the load seen by the PA output to change, increasing the gain of the amplifier 24. The first power detector 34A (FIG. 3) senses the excess, and the processor 26 decreases the input power to the amplifier 24. As represented in FIG. 8B, this results in the actual output power to settle at the ideal, but also causes the noise floor to decrease, measured as ACPR1. This represents an excess linearity margin, as the gain is higher than necessary. To increase the ACPR1 level, reducing margin while still meeting specifications, the processor 26 decreases $V_{CC}$ to decrease the power amplifier gain, and the signal is as shown in FIG. 8C. This is preferably according to the $V_{CC}$ predictive algorithm detailed above, or drawn form a table derived from a similar algorithm.

As is evident in FIG. 8C, while the gain is idealized, actual output power is below the ideal (below the desired output level) and the ideal noise floor is gone under. In response to the first power detector 34A sensing that the measured output power is less than ideal, the processor increases the input power (via the control 28 of FIG. 3), which causes the actual output power to settle at the desired output power as in FIG. 8D. Because this alone does not change gain, which was corrected in FIG. 8C, the noise floor increases to the ideal level also. Linearity is now met with the lowest draw of collector voltage $I_{CC}$.

Figure 9:
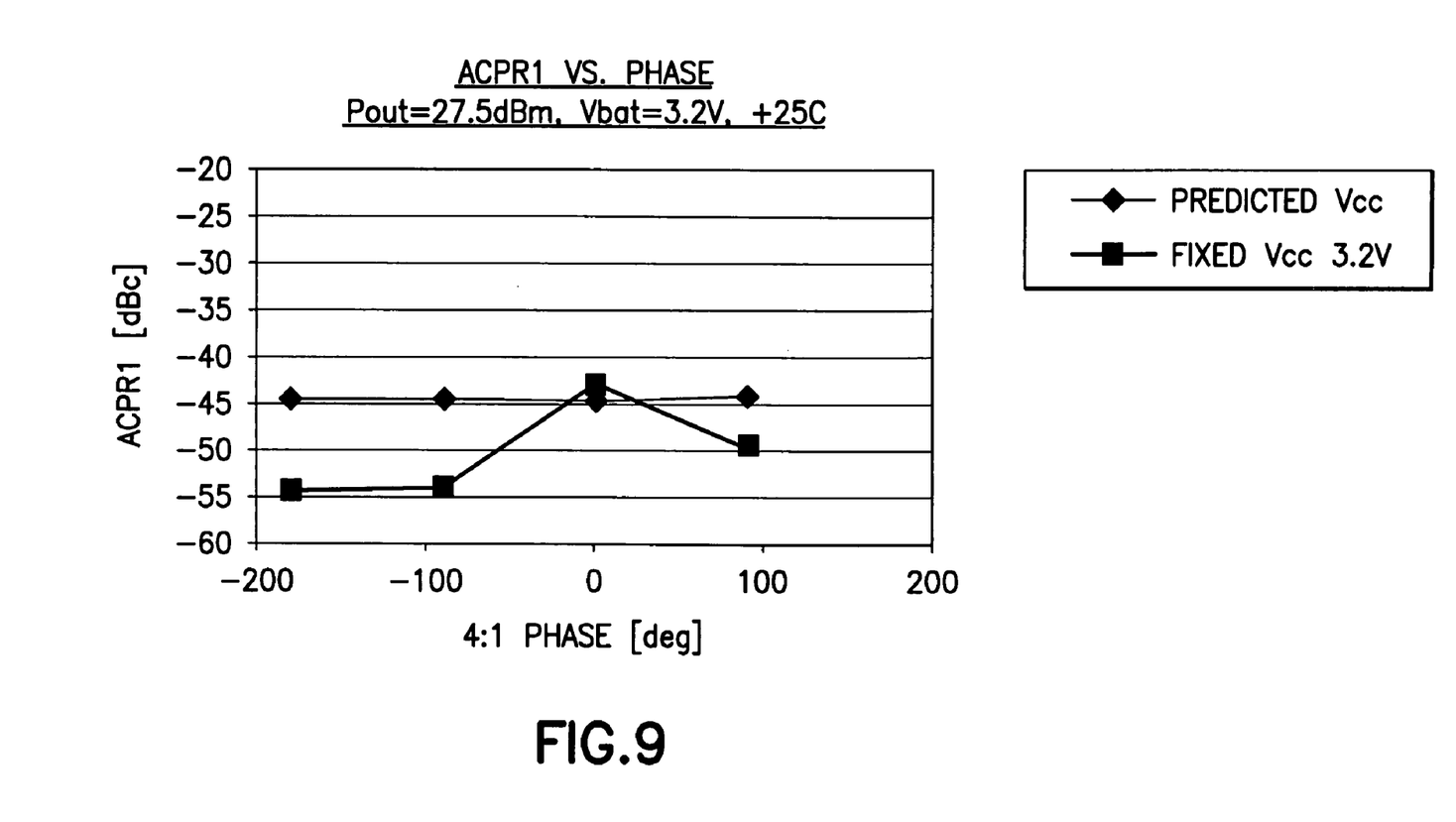
FIG. 9 is a graph comparing linearity between the predictive $V_{CC}$ of the present invention, and that of the prior art.
Figure 10:
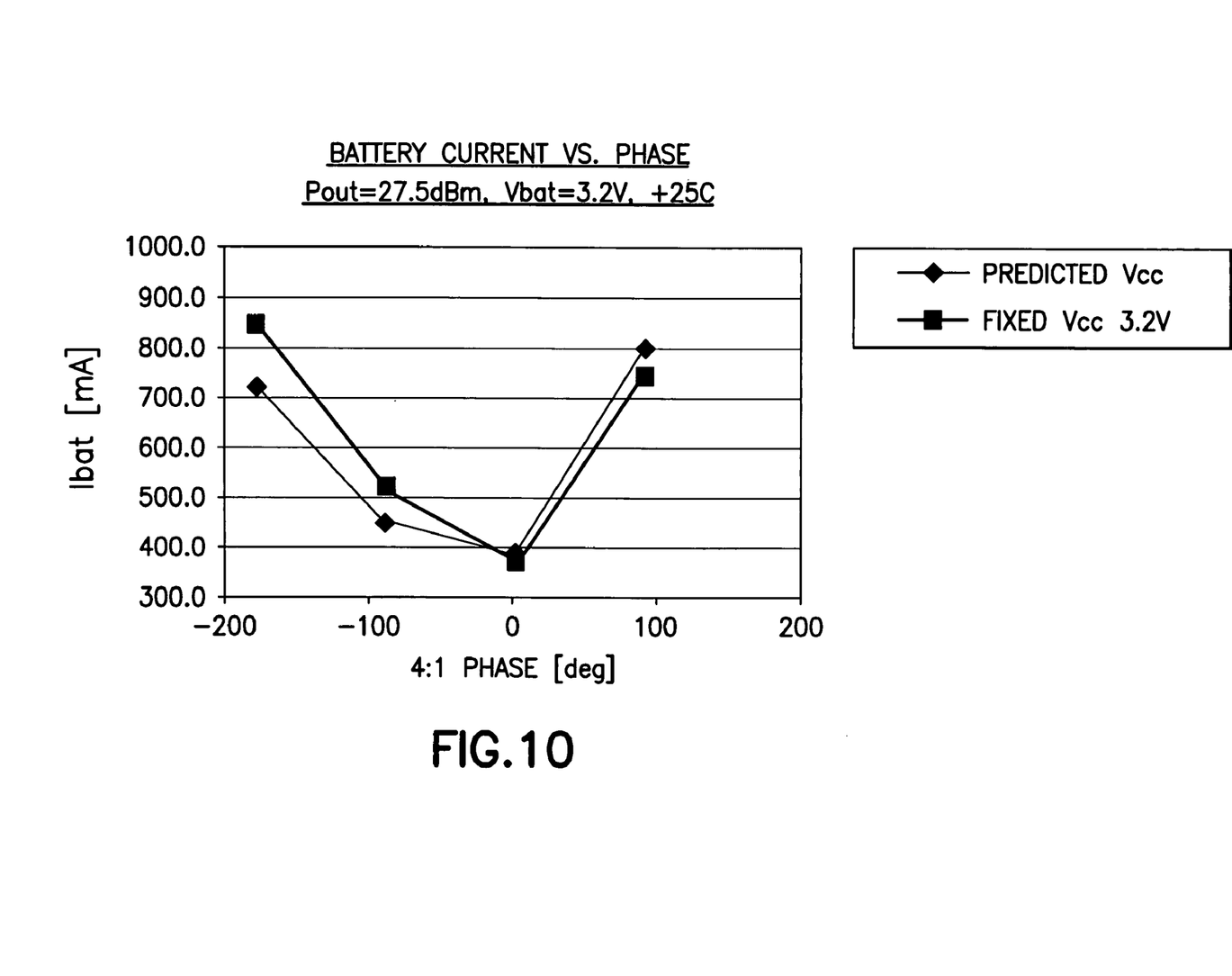
FIG. 10 is a graph showing collector current draw for the predictive $V_{CC}$ of the present invention as compared to the prior art.

FIG. 9 is a graph comparing linearity between the predictive $V_{CC}$ of the present invention, and that of the prior art according to FIG. 1 where only one $V_{CC}$ is available for each desired output power. FIG. 10 is a graph showing collector current draw for the predictive $V_{CC}$ of the present invention and the same prior art arrangement. Each result shows advantages in the present invention.

While there has been illustrated and described what is at present considered to be the preferred embodiment of the claimed invention, it will be appreciated that numerous changes and modifications are likely to occur to those skilled in the art. It is intended in the appended claims to cover all those changes and modifications that fall within the spirit and scope of the claimed invention.

What is claimed is:

1. A method comprising:
   applying a first collector voltage to an amplifier;
   measuring a first output power of a signal output from the amplifier while the first collector voltage is applied;
   determining a first difference between the first output power and a desired output power;
   in response to determining the first difference, adjusting an input power level of a signal input into the amplifier;
   applying a second collector voltage to the amplifier to change the amplifier gain;
   after applying the second collector voltage, measuring a second output power of a signal output from the amplifier;
   determining a second difference between the second output power and the desired output power; and
   in response to determining the second difference, adjusting an input power level of a signal input into the amplifier to achieve the desired output power without again changing the amplifier gain.

2. The method of claim 1, wherein adjusting the input power level of the signal input into the amplifier operates to match the output power with the desired output power.

3. The method of claim 1, wherein the first and second collector voltages are controlled by a processor.

4. The method of claim 3, wherein determining the first or second difference comprises providing a measurement of input power to the processor.

5. The method of claim 3, wherein the processor determines the second collector voltage by reference to a memory.

6. The method of claim 5 wherein the memory stores a plurality of collector voltages, each associated with one desired output power.

7. The method of claim 3 wherein the processor determines the second collector voltage by interpolating between discrete collector voltages stored in the memory.

8. The method of claim 1, wherein the second collector voltage comprises a minimum collector voltage necessary to maintain output power linearity as defined by an external requirement.

9. The method of claim 5 wherein the external requirement comprises a wireless telecommunication specification.

10. A method for applying a variable collector voltage to a power amplifier comprising:
    providing a memory that associates a plurality of collector voltages to a single output power level, and that associates at least two of said plurality of collector voltages with different input powers;
    measuring at a first time a first input power to the power amplifier, accessing the memory, and applying a first collector voltage to the power amplifier;
    outputting a signal from the power amplifier at a desired power;
    measuring at a second time a second input power to a power amplifier, accessing the memory, and applying a second collector voltage to the power amplifier; and
    outputting a signal from the power amplifier at the desired power;
    wherein all signals output from the power amplifier between the first and second times are at the desired power.

11. The method of claim 10, further comprising determining at least one of the first and second collector voltages by interpolating among at least two of the plurality of collector voltages in the memory.

12. A circuit comprising:
    a power amplifier;
    a first detector for measuring a first and second input power to the power amplifier;
    a second detector for measuring an actual output power from the power amplifier;
    a memory for storing a desired output power;
    a processor coupled to the memory, the first detector, and the second detector, the processor for determining a first and second collector voltage based on the desired output power and the respective first and second input power;
    a power controllable signal source having an output coupled to the power amplifier and a control input coupled to the processor, wherein the processor is further for controlling power of the power controllable signal source to the second input power using the desired output power, the actual output power, and the first input power; and
    a collector voltage supply coupled to the processor, the collector voltage supply for supplying the first and second collector voltage to the power amplifier;
    wherein the power amplifier outputs a signal at the desired output power in response to each of the first and the second collector voltages.

13. The circuit of claim 12 wherein the detector and the collector voltage supply are analog devices.

14. The circuit of claim 12 wherein the collector voltage supply comprises a DC-to-DC converter.

15. A circuit comprising:
    a power amplifier;
    a detector for measuring a first and second input power to the power amplifier;
    a memory for storing a desired output power;
    a processor coupled to the memory and the detector, the processor for determining a first and second collector voltage based on the desired output power and the respective first and second input power; and a collector voltage supply coupled to the processor, the collector voltage supply for supplying the first and second collector voltage to the power amplifier;

wherein the power amplifier outputs a signal at the desired output power in response to each of the first and the second collector voltages, the memory is for storing a plurality of collector voltages, each collector voltage associated with a particular output power and a particular measured input power, the processor is for determining the first and second collector voltages from the memory, and wherein the processor is for interpolating between at least two of the plurality of collector voltages associated with the desired output power to determine at least one of the first and second collector voltages.

16. A circuit comprising:

a power amplifier;

a detector for measuring a first and second input power to a power amplifier;

a memory for storing a desired output power;

a processor coupled to the memory and the detector, the processor for determining a first and second collector voltage based on the desired output power and the respective first and second input power; and a collector voltage supply coupled to the processor, the collector voltage supply for supplying the first and second collector voltage to the power amplifier;

wherein the power amplifier outputs a signal at the desired output power in response to each of the first and the second collector voltages, said circuit disposed in a mobile station that comprises an antenna having an input coupled to an output of the power amplifier, wherein each of the first and second collector voltages are independent of a change to antenna load.

17. The circuit of claim 16 wherein the memory is for storing a plurality of collector voltages, each collector voltage associated with a particular desired output power and a particular measured input power, and the processor is for determining the first and second collector voltage from the memory.

18. The circuit of claim 17, wherein each of the collector voltages associated with the desired output power is a minimum collector voltage that assures power linearity according to a telecommunication standard by which the mobile station communicates.

19. The circuit of claim 18 wherein each of the collector voltages are further associated with a frequency and a temperature.

20. The circuit of claim 18, further comprising a second detector having an output coupled to an input of the processor for measuring an actual output power from the power amplifier, wherein each of the collector voltages are further associated with an actual output power.

21. The circuit of claim 20 wherein the second detector comprises a directional coupler.

22. A program of machine-readable instructions, tangibly embodied on an information bearing medium and executable by a digital data processor, to perform actions directed toward dynamically determining a collector voltage, the actions comprising:

providing an input power control signal to a signal source;

receiving a measured output power of a power amplifier;

accessing a desired output power from a memory;

determining a difference between the measured output power and the desired output power;

in response to determining the difference, adjusting the input power control signal;

changing a collector voltage applied to the amplifier to change the amplifier gain.

23. An adaptive power amplifier circuit comprising:

power amplifying means;

first detector means for measuring first and second input power values to the power amplifier means;

second detector means for measuring an actual output power value from the power amplifying means;

memory means for storing a desired output power value;

processing means coupled to the memory means and to the first and second detector means for determining first and second collector voltages based on the desired output power value and the respective first and second input power values;

collector voltage supply means coupled to the processing means for supplying the first and second collector voltages to the power amplifying means; and a power controllable signal source having an output coupled to the power amplifying means and a control input coupled to the processing means, wherein the processing means is further coupled to the second detector means and is for controlling power of the power controllable signal source to the second input power value using the desired output power value, the actual output power value, and the first input power value;

wherein the power amplifying means applies the first collector voltage to a signal input with the first input power value to output a first signal at the desired output power value, and further applies the second collector voltage to a signal input with the second input power value to output a second signal at the desired output power value.

24. The adaptive power amplifier circuit of claim 23, wherein:

the power amplifying means comprises a power amplifier;

the first and second detector means each comprises a power level detector, respectively coupled to an input and an output of the power amplifier;

the memory means comprises a computer readable memory for storing a relation between desired output power value, input power value, and collector voltage value;

the processing means comprises a computer processor; and the collector voltage supply means comprises a collector voltage controller coupled to an input of the power amplifier.

* * * * *

UNITED STATES PATENT AND TRADEMARK OFFICE
CERTIFICATE OF CORRECTION

| | |
|---|---|
| PATENT NO. | : 7,190,221 B2 |
| APPLICATION NO. | : 10/971172 |
| DATED | : March 13, 2007 |
| INVENTOR(S) | : Henze |

Page 1 of 1

It is certified that error appears in the above-identified patent and that said Letters Patent is hereby corrected as shown below:

IN THE CLAIMS:

In Claim 2: Column 9, line 52, after "amplifier" insert --to achieve the desired output power--.

In Claim 16: Column 11, line 19, delete "a" and insert --the--.

Signed and Sealed this

Twenty-second Day of May, 2007

JON W. DUDAS
*Director of the United States Patent and Trademark Office*